United States Patent [19]
Nagle et al.

[11] 4,418,820
[45] Dec. 6, 1983

[54] CIRCUIT BOARD CASE

[76] Inventors: Joseph J. Nagle, 165 Ten Rod Rd., Rochester, N.H. 03867; Joseph Vitko, Jr., 32 Lexington St., Dover, N.H. 03820

[21] Appl. No.: 314,182

[22] Filed: Oct. 23, 1981

[51] Int. Cl.³ .................... B65D 73/02; H02B 1/04
[52] U.S. Cl. ............................... 206/334; 206/451; 206/453; 211/41
[58] Field of Search ............... 206/334, 328, 451, 452, 206/453, 455, 456; 211/40, 41, 42, 43, 72, 175, 188, 194

[56]     References Cited
       U.S. PATENT DOCUMENTS

| | | | |
|---|---|---|---|
| 3,136,414 | 6/1964 | Mackay | 206/334 |
| 4,184,599 | 1/1980 | Drake | 206/334 |
| 4,248,348 | 2/1981 | Johnson | 206/334 |
| 4,261,464 | 4/1981 | Maitland | 206/334 |

*Primary Examiner*—Joseph Man-Fu Moy

[57]     ABSTRACT

A carrying case for printed circuit boards and the like is closed as comprising a case A and a cover B forming a closed container when fitted together. Interchangeable insert C is carried in an interior of the case A which includes grooves 22, 24 receiving and supporting side edges 26a, b of two intersecting sides of boards 26. Fastening means 30, 34, 18a, 20a secures insert C in the case facilitating interchanging to accommodate different circuit board arrangements. A clamp assembly D carried by the case engages remaining sides of boards clamping same tightly in the case which is adjustable to accommodate different size circuit boards. The case and cover have a configuration permitting nesting of the case within the cover. Closure E is carried by cover B having a first operable position securing the case and cover together in their container configuration and a second operable position providing a base support for the case and cover in their nested configuration supporting same on a table surface and the like in a working position tilted rearwardly for convenient access and retention of the circuit boards.

11 Claims, 5 Drawing Figures

CIRCUIT BOARD CASE

BACKGROUND OF THE INVENTION

The invention relates to a case and rack device which is designed to package printed circuit boards for shipping and for in-plant handling, processing, and storage in such a way that they are kept separated and held firmly in place.

In the handling and processing of printed circuit boards having miniature electrical circuits printed thereon, it becomes necessary to support the circuit boards at work stations preferable in a rack or like devices. It is also necessary in the handling of the circuit boards to transport and ship the same.

Heretofore, printed circuit board rack devices have been proposed for the storage and handling of printed circuit boards such as disclosed in U.S. Pat. Nos. 3,723,821 and 3,271,626. However, these devices do not afford a closed container for the circuit boards and the access to the individual circuit boards provided is not entirely satisfactory.

It has been known to provide packaging containers which fit on a diagonal such as disclosed in U.S. Pat. Nos. 3,927,389 and 2,217,455 which are directed to the provision of economical disposable packaging for various articles. U.S. Pat. No. 3,018,003 discloses trays which may be nested within each other and may be connected together to form closed containers which may then be stacked on top of each other in tiers.

However, none of the conventional packages deal with the purposes and problems associated with the handling and shipping of printed circuit boards and would not be suitable as such.

Accordingly, an important object of the present invention is to provide a container for printed circuit boards and the like which will accommodate circuit boards for in-plant handling and storage and for shipping.

Yet another important object of the present invention is to provide a container for printed circuit boards which will convert as a storage rack and provide easy access to the boards at work stations.

Still another important object of the invention is to provide a basic container for circuit boards which utilizes interchangeable inserts having grooves which receive and position the circuit boards whereby inserts may be interchanged to meet the special needs and requirements of the user.

Yet another important object of the present invention is to provide a container for printed circuit boards which utilizes a case having a removable cover and a clamp assembly which holds the circuit boards firmly in the case with or without the presence of the cover and accommodates circuit boards of different sizes.

Still another important object of the present invention is to provide a container for printed circuit boards having a separable case and cover members and a unique closure member therefor which locks the members together in a container configuration and which supports the members in a tilted working position when arranged in a nested configuration.

SUMMARY OF THE INVENTION

The above objectives are accomplished according to the invention by the provision of a case in which printed circuit boards are supported and positioned and a separable cover which interconnects with the case to provide a container. Interchangeable inserts are carried within the case having grooves that receive and hold side edges of intersecting sides of the circuit board. A clamp assembly carried by the case includes an elongated clamping member having compressible elastomeric clamping strips engaging the remaining side edges of the circuit boards clamping the boards tightly in the case while being adjustable to accommodate boards of different sizes. The case and cover are of such dimensions and configuration to permit nesting of the case in the cover. Means for attaching the cover and case to provide a container for handling and shipping includes a closure member which secures the members in a container configuration while pivoting to a support position to support the case and cover in a nested configuration tilted rearwardly for convenient access and retention of the boards at a work station.

BRIEF DESCRIPTION OF THE DRAWINGS

The construction designed to carry out the invention will be hereinafter described, together with other features thereof.

The invention will be more readily understood from a reading of the following specification and by reference to the accompanying drawings forming a part thereof, wherein an example of the invention is shown and wherein.

DESCRIPTION OF A PREFERRED EMBODIMENT

Figure 1:
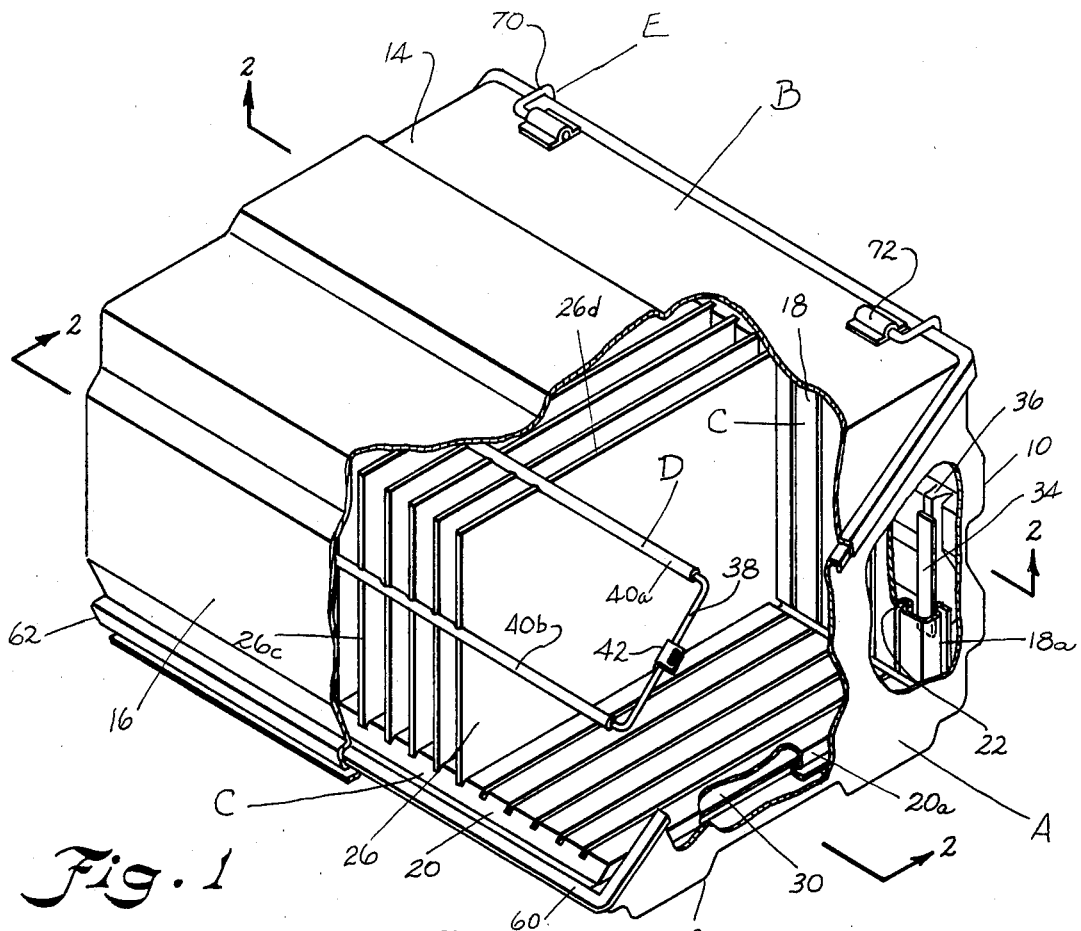
FIG. 1 is a perspective view with parts cut away illustrating a container for circuit boards constructed in accordance with the present invention.
Figure 2:
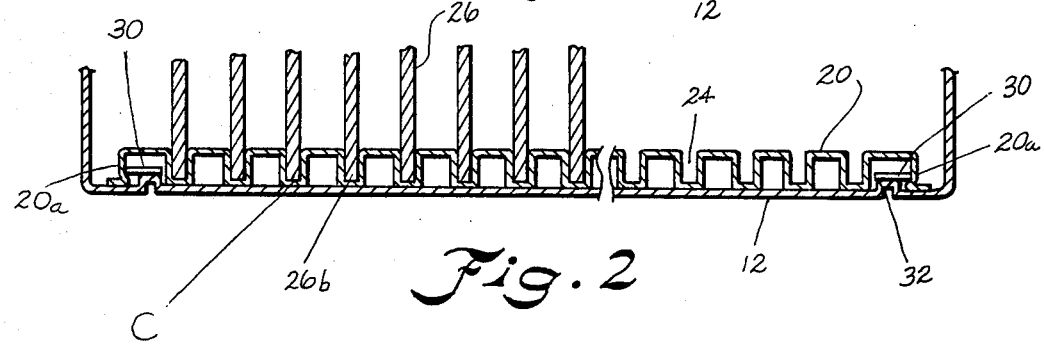
FIG. 2 is a sectional view taken along 2—2 of FIG. 1.
Figure 3:
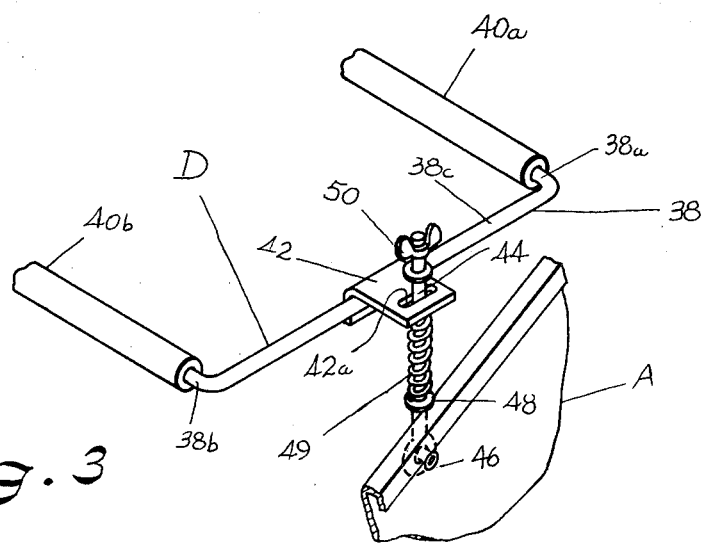
FIG. 3 is a perspective view illustrating a clamping assembly constructed according to the present invention.

A container case device for printed circuit boards and the like is disclosed which includes a case A and a separable cover B which forms a closed container when interfitted with case A. Insert means C is carried in an interior of the case which includes groove means receiving and supporting side edges of two intersecting sides of the circuit boards. A means for fastening the insert means in the case is provided. A clamp assembly D is carried by the case engaging the remaining sides of the circuit boards clamping the boards tightly in the case. Releasable attachment means interconnects the case and cover which have dimensions and a configuration permitting nesting of the case within the cover. Closure means E carried by the cover has a first operable position securing the case and cover together in their attached container configuration and a second operable position providing a base support for the case and cover in their nested configuration supporting the same on a table surface and the like in a working position.

Referring now in more detail to the drawings, case A is disclosed as including a major back side 10 and bottom side or surface 12 generally perpendicular to each other. Cover B includes a top major surface 14 and front major surface 16 which comprise top and back sides. The cover and case, and insert panels C, are preferably formed from a molded thermoplastic material. Insert means C is provided in the form of a pair of insert panels 18 and 20 which are carried on back side 10 and bottom 12, respectively. Groove means are provided by elongated grooves or slits 22 and 24 formed in the panels 18 and 20, respectively, in which the edges of intersecting sides 26a and 26b of circuit boards 26 are received positioning the circuit boards in spaced apart configuration. As illustrated, the grooves 22 and 24 are aligned generally perpendicular with one another to receive a circuit board. Means fastening the panels in the carrying case are provided by ledge means in the form of a protruding ledge 30 carried by raised portion 32 on bottom surface 12 and 34 carried by raised portion 36 on back surface 10. Raised portions 32 and 34 space the protruding ledges 30 and 34 above the respective surfaces so that a pair of resilient legs 18a and 20a of each insert panel may snap over the respective ledge facilitating use of insert panels to suit the application and needs of the user.

Clamp assembly D is illustrated in the form of a pair of clamping strip means in the form of a rectangular wire frame 38 having spaced legs 38a and 38b covered with a layer of compressible elastomeric clamping material 40a and 40b which engages the remaining sides 26c and 26d of each circuit board 26. Affixed to the leg 38c of frame 38 is a connecting member 42 having a slot 42a formed therein. A threaded member 44 is pivotably connected to the side of case A by means of a rivet connection 46. A washer 48 is fixed to member 44 which also receives a spring 49 over the post of the member. Connecting member 42 is received also over the post against the spring 49 and a wingnut is provided which tightens clamp members 40a and 40b against the respective sides of the circuit boards.

Figure 4:
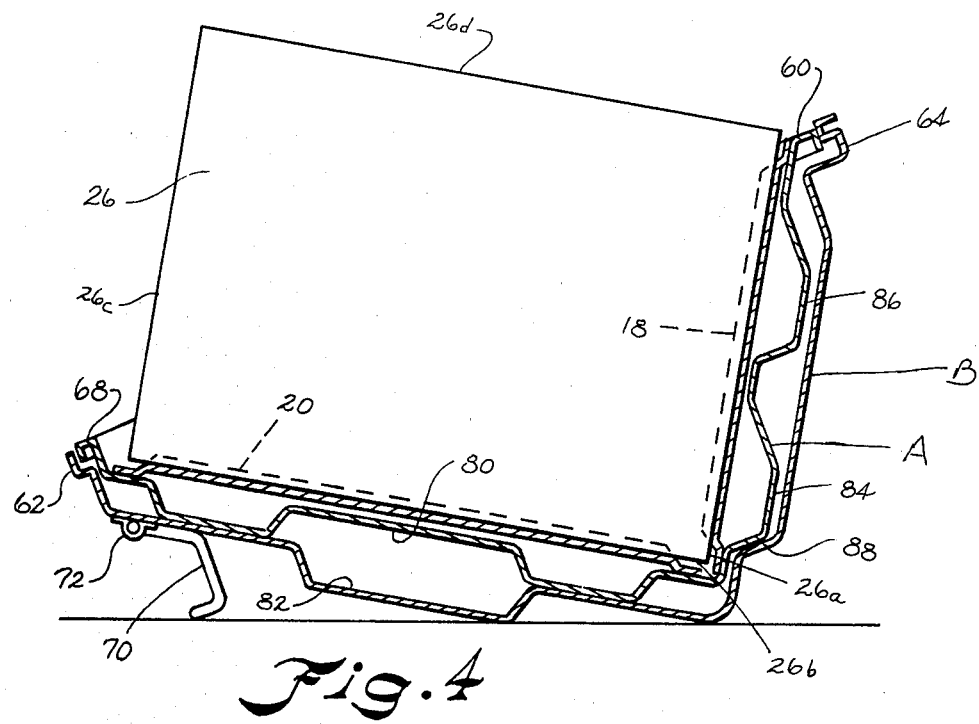
FIG. 4 is a side elevation, partially sectioned, illustrating the case and cover member constructed according to the present invention in a nested configuration.
Figure 5:
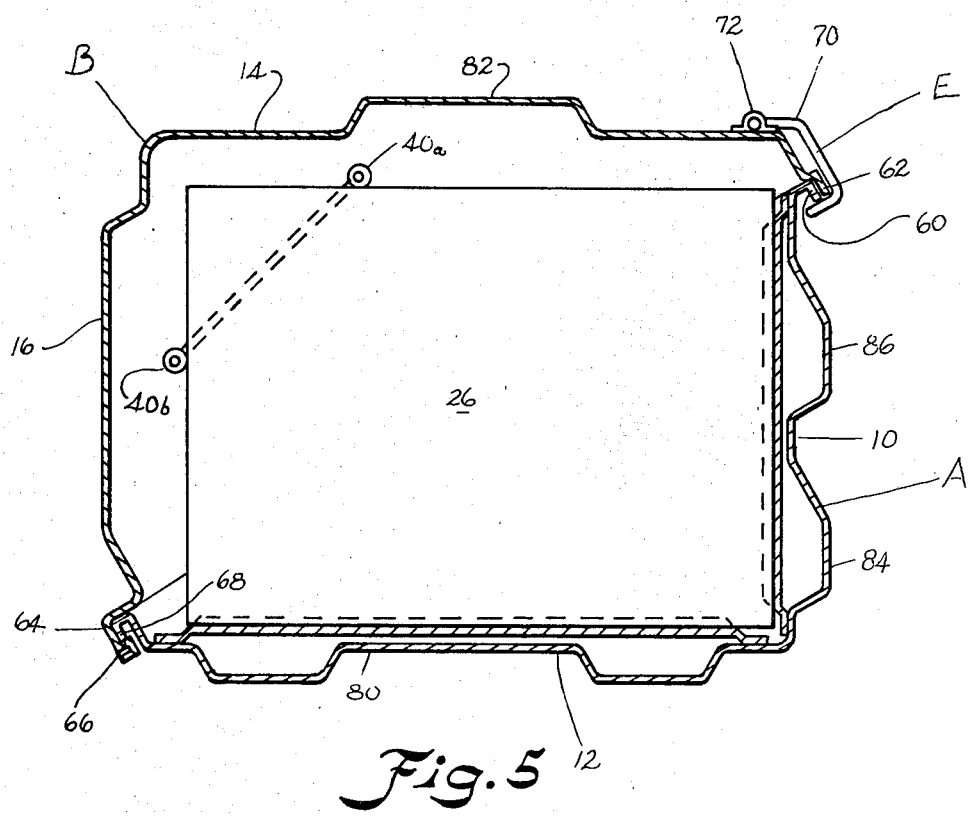
FIG. 5 is a side elevation, partially sectioned, illustrating the case and cover members in a container configuration according to the invention.

Referring now to FIGS. 4 and 5, the nesting and container configurations of the device according to the invention can best be seen. The case A includes a peripheral flange means 60 around the entire edge thereof and the cover B includes a peripheral flange means 62 around its entire border which overlyes the flange means 60 in their fitted container configuration, as best seen in FIG. 5. It will be noted that a portion 64 of flange means 62 along wall 16 includes an inwardly extending flange portion 66 which engages underneath the flange 68 of the case to form a part of the means for fastening and interlocking the two together. With flange portion 66 engaging the flange portion 68 of means 60, closure means E is received over the ends of flange means 60 and 62, securing the container device together. For this purpose, closure means E is illustrated in the form of a clamp bar 70 which is pivotally carried by the cover B by means of hinge brackets 72.

In accordance with the invention, the clamping bar 72 has a first position in which it secures the case and cover together in their container configuration, and a second position in which it serves as a support means for the case and cover in their nested configurations, as best seen in FIG. 4. In this position, the clamping bar 70 rests on the surface of a table 74 or the like surface for supporting the case and cover in their nested configuration whereby the circuit boards are tilted rearwardly. This is an important feature since it is in this position and configuration that the container of the invention is converted into a storage rack at a working station where the boards are supported on two edges only for convenient access while being urged rearwardly for retention in the case. Clamp assembly D allows the device to be utilized with different size circuit boards (one size at a time) and interchangeable inserts C also facilitates use with different sizes and arrangements resulting in a versatile case device for circuit board handling and shipping.

It will be noted that the case A includes an indented bottom portion 80 and that the cover B includes a raised portion 82. Thus, the device according to the invention may be stacked one upon the other and interlocked in their container configuration. It is also noted that the case includes abutment portions 84 and 86 such that in their nested configurations the abutment portion 84 rests against a complimentary abutment surface 88 in the cover B. Such provides a stable interlocking configuration facilitating use as a rack.

While a preferred embodiment of the invention has been described using specific terms, such description is for illustrative purposes only, and it is to be understood that changes and variations may be made without departing from the spirit or scope of the following claims.

What is claimed is:

1. A carrying case for printed circuit boards and the like comprising:
   a case;
   a cover forming a closed container when fitted together with said case;
   interchangeable insert means carried in an interior of said case including groove means receiving and supporting side edges of two intersecting sides of said boards;
   fastening means securing said insert means in said case;
   a clamp assembly carried by said case engaging remaining sides of said boards clamping same tightly in said case;
   attachment means interconnecting said case and cover;
   said case and cover having a configuration permitting nesting of said case within said cover;
   closure means carried by said cover having a first operable position securing said case and cover together in said container configuration and a second operable position providing a base support for said case and cover in said nester configuration supporting same on a table surface and the like in a working position.

2. The device of claim 1 wherein said insert means includes first and second inserts carried on mutually perpendicular sides of said case each of which includes elongated grooves formed therein in which said boards are received and supported.

3. The device of claim 2 wherein said fastening means includes protruding ledge means carried by said case, said first and second inserts including resilient leg means snapping over said ledge means.

4. The device of claim 1 wherein said clamp assembly includes elongated clamping strip means carried across said case constructed of compressible elastomeric material and means urging said strip means against said sides of said circuit boards holding same tightly in place.

5. The device of claim 1 wherein said closure means includes a pivotal member which swings into said second support position supporting said case and cover in a rearwardly tilted position affording convenient access to said circuit boards while urging same rearwardly for retention in said case.

6. The device of claim 1 wherein said case and cover are fitted together generally on a diagonal.

7. The device of claim 1 including flange means formed on the periphery of said case and cover, said flange means of said cover overlapping and fitting upon said case.

8. The device of claim 7 including an inwardly extending flange formed on a portion of said cover flange means engaging underneath said case flange means when said case and cover are in said container configuration interconnecting same together.

9. A device for carrying printed circuit boards and the like comprising:
   a case including a major bottom and back surface generally perpendicular to one another;
   a cover including major top and front surfaces generally perpendicular to one another;
   said case and cover interfitting with one another to form a closed container;
   aligned groove means carried by said major surfaces of said case receiving and supporting two intersecting sides of said circuit boards; and
   a clamp assembly carried by said case including an adjustable clamping member clamping against remaining sides of said circuit boards accommodating and clamping boards of different size tightly in said case.

10. The device of claim 9 wherein said case and cover have a configuration permitting nesting of said case in said cover.

11. The device of claim 10 including closure means securing said case and cover together in said container configuration including a pivotal support carried by said cover which supports said cover in a tilted position with said case and cover are in said nested configuration providing support and access to said circuit boards on a table surface and the like at a work station while urging said boards rearwardly for retention.

* * * * *